(12) United States Patent
Yamaguchi et al.

(10) Patent No.: US 10,748,782 B2
(45) Date of Patent: Aug. 18, 2020

(54) METHOD OF MANUFACTURING SEMICONDUCTOR DEVICE

(71) Applicant: TOKYO ELECTRON LIMITED, Tokyo (JP)

(72) Inventors: Tatsuya Yamaguchi, Nirasaki (JP); Reiji Niino, Nirasaki (JP); Makoto Fujikawa, Nirasaki (JP); Yoshihiro Hirota, Tokyo (JP); Rong Yang, Tokyo (JP); Tomonari Yamamoto, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/165,250

(22) Filed: Oct. 19, 2018

(65) Prior Publication Data

US 2019/0122894 A1 Apr. 25, 2019

(30) Foreign Application Priority Data

Oct. 23, 2017 (JP) .................................. 2017-204747

(51) Int. Cl.
*H01L 21/31* (2006.01)
*H01L 21/311* (2006.01)
(Continued)

(52) U.S. Cl.
CPC .... *H01L 21/31144* (2013.01); *C23C 16/0245* (2013.01); *C23C 16/4584* (2013.01);
(Continued)

(58) Field of Classification Search
CPC ......... H01L 21/31144; H01L 21/02118; H01L 21/02271; H01L 21/266; H01L 29/66795; H01L 27/1085
USPC ........................................................ 438/514
See application file for complete search history.

(56) References Cited

U.S. PATENT DOCUMENTS

| 2005/0227482 A1* | 10/2005 | Korzenski | ............... C11D 3/042 438/639 |
| 2006/0115990 A1* | 6/2006 | Seino | .................. H01L 21/0332 438/736 |

(Continued)

FOREIGN PATENT DOCUMENTS

| JP | 2006-120759 A | 5/2006 |
| JP | 2006120759 A * | 5/2006 |

*Primary Examiner* — Sheikh Maruf
(74) *Attorney, Agent, or Firm* — Nath, Goldberg & Meyer; Jerald L. Meyer

(57) ABSTRACT

There is provided a method of manufacturing a semiconductor device by processing a substrate, which includes: embedding a polymer having a urea bond in a recess formed in the substrate by supplying a material for polymerization from above a sacrificial film to the substrate and forming a polymer film made of the polymer having the urea bond, wherein a surface of the substrate is covered with the sacrificial film, the recess including an opening of the sacrificial film that is formed by a patterning; removing the polymer film formed on the sacrificial film while leaving the polymer embedded in the recess; removing the sacrificial film in a state in which the polymer is embedded in the recess; and subsequently, removing the polymer embedded in the recess.

10 Claims, 19 Drawing Sheets

(51) Int. Cl.
  *H01L 21/768* (2006.01)
  *H01L 21/02* (2006.01)
  *H01L 21/266* (2006.01)
  *C23C 16/458* (2006.01)
  *C23C 16/48* (2006.01)
  *C23C 16/02* (2006.01)
  *H01L 21/3213* (2006.01)
  *H01L 27/108* (2006.01)
  *H01L 21/67* (2006.01)
  *H01L 21/3105* (2006.01)
  *H01L 29/66* (2006.01)

(52) U.S. Cl.
  CPC ...... *C23C 16/481* (2013.01); *H01L 21/02118* (2013.01); *H01L 21/02271* (2013.01); *H01L 21/02282* (2013.01); *H01L 21/266* (2013.01); *H01L 21/31058* (2013.01); *H01L 21/31122* (2013.01); *H01L 21/31133* (2013.01); *H01L 21/31138* (2013.01); *H01L 21/32134* (2013.01); *H01L 21/6715* (2013.01); *H01L 21/76808* (2013.01); *H01L 27/1085* (2013.01); *H01L 29/66795* (2013.01)

(56) References Cited

U.S. PATENT DOCUMENTS

| | | | |
|---|---|---|---|
| 2008/0057682 A1* | 3/2008 | Bresolin | H01L 21/31144 438/514 |
| 2009/0291547 A1* | 11/2009 | Schraub | H01L 21/26513 438/514 |
| 2011/0212609 A1* | 9/2011 | Okuda | H01L 24/11 438/514 |
| 2012/0285481 A1* | 11/2012 | Lee | C23C 16/0245 134/1.1 |
| 2013/0105303 A1* | 5/2013 | Lubomirsky | H01J 37/32357 204/192.34 |
| 2013/0337649 A1* | 12/2013 | Tachibana | G03F 7/094 438/694 |
| 2014/0295654 A1* | 10/2014 | Hsieh | H01L 21/26506 438/514 |
| 2014/0322921 A1* | 10/2014 | Ahmad | H05B 6/80 438/780 |
| 2015/0118832 A1* | 4/2015 | Wood | H01L 21/31122 438/514 |
| 2015/0155180 A1* | 6/2015 | Ban | H01L 21/0274 438/514 |
| 2015/0191621 A1* | 7/2015 | Abe | C08G 18/6229 428/419 |
| 2015/0255287 A1* | 9/2015 | Shoji | H01L 21/31138 438/514 |
| 2016/0027638 A1* | 1/2016 | Brown | H01L 21/0337 438/514 |
| 2016/0064220 A1* | 3/2016 | Ogihara | H01L 21/02126 438/514 |
| 2016/0211142 A1* | 7/2016 | Kim | H01L 21/02115 |
| 2017/0327627 A1* | 11/2017 | Cheng | C08G 18/757 |
| 2018/0286744 A1* | 10/2018 | Yamaguchi | H01L 21/32139 |
| 2019/0092898 A1* | 3/2019 | Cheng | C08J 5/18 |

* cited by examiner

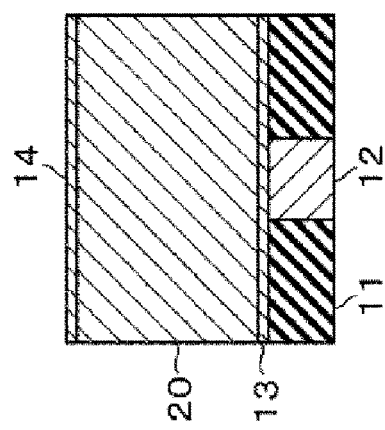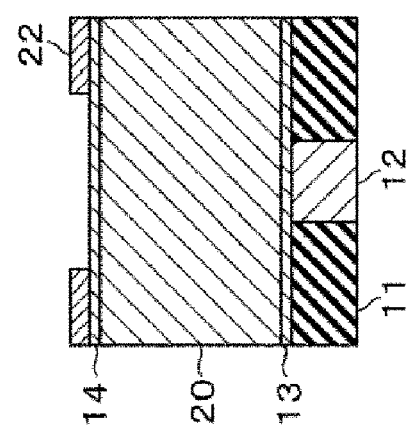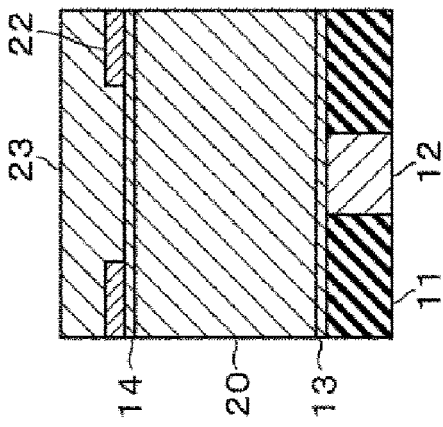

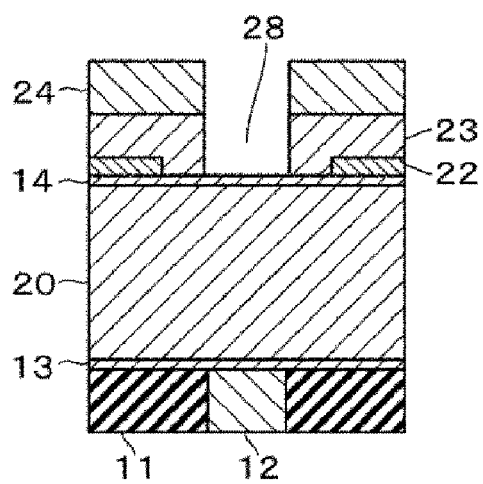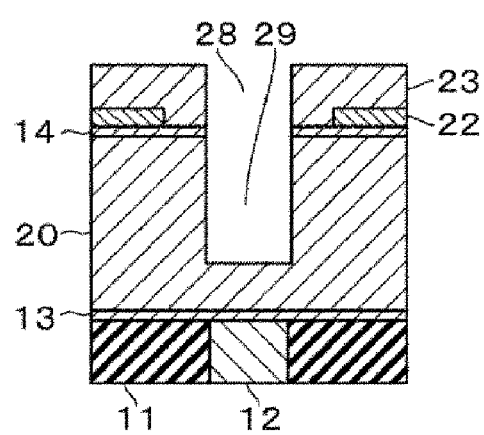

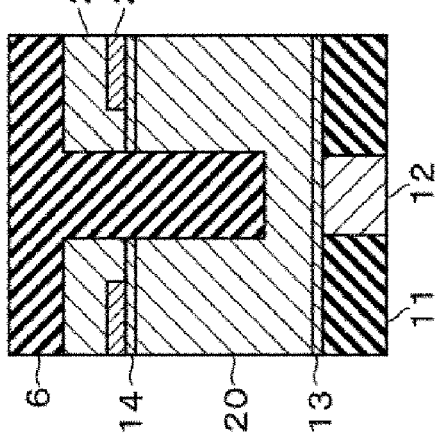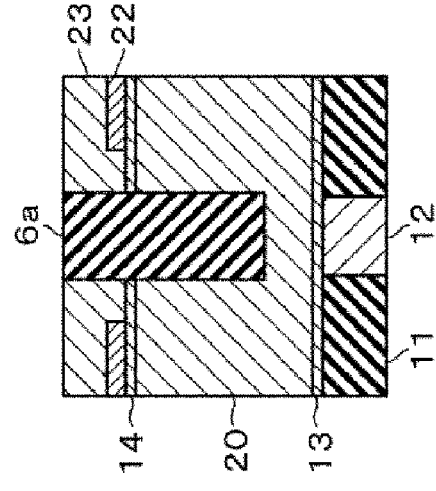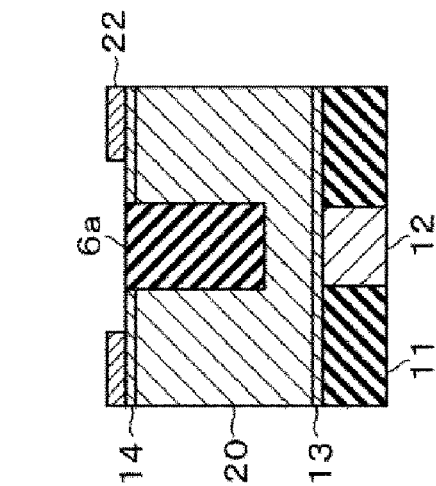

FIG. 5C
FIG. 5B
FIG. 5A
FIG. 6
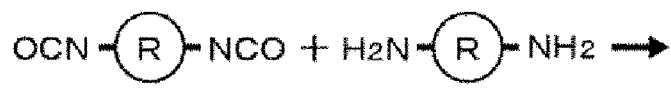
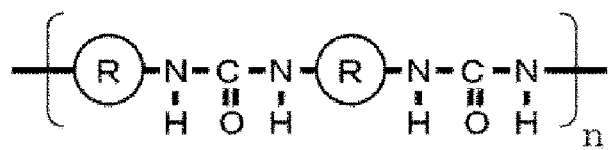

(C: 65%, H: 10%, O: 10%, N: 15%)

(C: 68%, H: 6%, O: 10%, N: 16%)

(C: 73%, H: 4%, O: 9%, N: 14%)

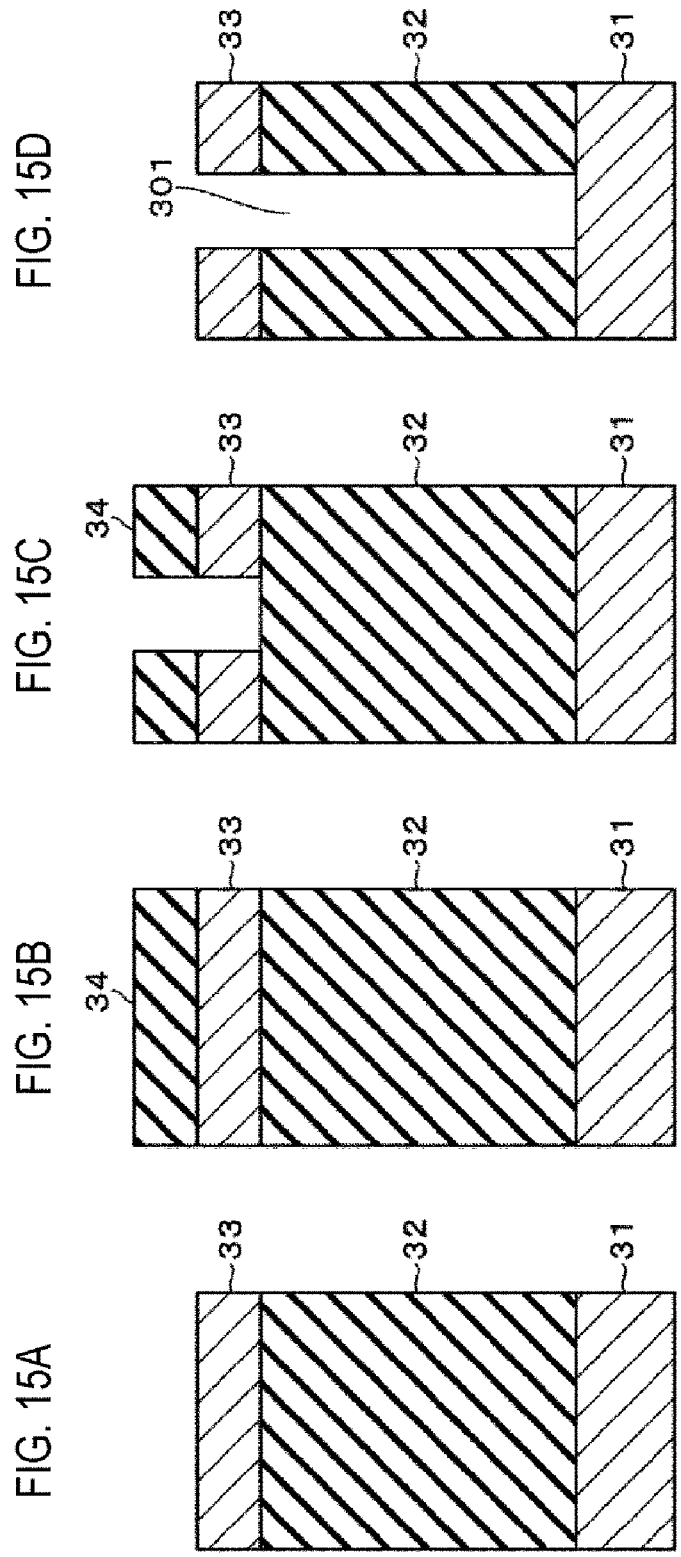

METHOD OF MANUFACTURING SEMICONDUCTOR DEVICE

CROSS-REFERENCE TO RELATED APPLICATION

This application is based upon and claims the benefit of priority from Japanese Patent Application No. 2017-204747, filed on Oct. 23, 2017, the entire contents of which are incorporated herein by reference.

TECHNICAL FIELD

The present disclosure relates to a technique for manufacturing a semiconductor device using a sacrificial film.

BACKGROUND

In a manufacturing process of a semiconductor device, a film called a sacrificial film may be used in some cases. The sacrificial film is a film used in the manufacturing process and removed in the middle of the manufacturing process so that the film is not included in a semiconductor device as a product. Examples of the sacrificial film include an intermediate mask formed on the lower layer side of a resist mask in a corresponding relationship with the resist mask, an intermediate film used for separating a trench and a via hole in a dual damascene, and the like. As the sacrificial films, suitable films are selected from various film materials such as inorganic films and organic films in consideration of the intended use thereof and the like.

The sacrificial film used in a predetermined manufacturing process is removed by dry etching that makes use of a plasma etching gas, wet etching that makes use of an etching solution, or the like. Meanwhile, an opening such as a trench, a via hole or the like may be formed on the surface of a semiconductor device (hereinafter also referred to as "structure") in the middle of manufacture after using the sacrificial film. If an etching gas or an etching solution (collectively referred to as "etchant") enters the structure through the opening, there is a possibility that a member existing inside the structure comes into contact with the etchant and suffers from damage such as deterioration or the like.

For example, there is available a technique of forming a via hole in a silicon layer using an etching mask corresponding to a sacrificial film and then embedding a protective portion made of a material such as polyimide resin, organic SOG, photosensitive resist or the like in the via hole.

The technique of the related art prevents hydrofluoric acid, hot phosphoric acid or the like used for removing an etching mask from entering the via hole by using the protective portion. However, the protective part itself is also ultimately removed from the semiconductor device which is a product. Therefore, there is also a possibility of causing damage to the interior of the structure in the process of removing the protective portion.

SUMMARY

Some embodiments of the present disclosure provide a method of manufacturing a semiconductor device that is capable of removing a sacrificial film while suppressing occurrence of damage attributable to entry of an etchant through an opening formed in a semiconductor manufacturing apparatus.

According to one embodiment of the present disclosure, there is provided a method of manufacturing a semiconductor device by processing a substrate, which includes: embedding a polymer having a urea bond in a recess formed in the substrate by supplying a material for polymerization from above a sacrificial film to the substrate and forming a polymer film made of the polymer having the urea bond, wherein a surface of the substrate is covered with the sacrificial film, the recess including an opening of the sacrificial film that is formed by a patterning; removing the polymer film formed on the sacrificial film while leaving the polymer embedded in the recess; removing the sacrificial film in a state in which the polymer is embedded in the recess; and subsequently, removing the polymer embedded in the recess.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 1A to 1C are first explanatory views showing a semiconductor device manufacturing method according to a first embodiment.

FIGS. 3A and 3B are third explanatory views showing the semiconductor device manufacturing method according to the first embodiment.

FIGS. 4A to 4C are fourth explanatory views showing the semiconductor device manufacturing method according to the first embodiment.

FIGS. 5A to 5C are fifth explanatory views showing the semiconductor device manufacturing method according to the first embodiment.

FIG. 6 is an explanatory view showing how a polymer having a urea bond is produced by a copolymerization-based reaction.

FIGS. 15A to 15D are first explanatory views showing a semiconductor device manufacturing method according to a second embodiment.

DETAILED DESCRIPTION

Figure 2A:
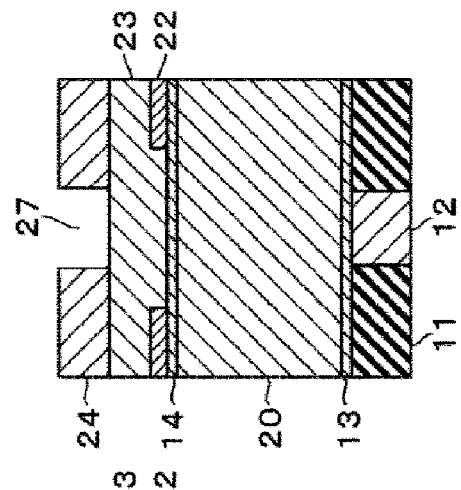
FIGS. 2A to 2C are second explanatory views showing the semiconductor device manufacturing method according to the first embodiment.

Embodiments to which the present disclosure is applied will be described with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

First, description will be made on an embodiment in which a semiconductor device manufacturing method according to the present disclosure is applied to a process of forming a wiring of a semiconductor device. Specifically, a technique of using a polyurea polymer film (polyurea film 6) to form a recess (trench 291) through the use of a hard mask 22 which is a sacrificial film, will be described with reference to FIGS. 1A to 5N. FIGS. 1A to 5N show examples of a structural body in the course of manufacturing a semiconductor device. The structural body is formed on a semiconductor wafer (hereinafter referred to as "wafer") W which is a substrate.

In the manufacturing process described with reference to FIGS. 1A to 5N, a via hole 29 or a trench 291 is formed by a dual damascene method using an SOC (Spin-On-Carbon) film 23 or the hard mask 22 in a low dielectric constant film 20 which is used as an interlayer insulating film and made of a SiOC film (silicon oxide film containing carbon and oxygen).

FIGS. 1A to 5N are explanatory views showing stepwise how to form an upper-lying circuit portion on an underlying circuit portion. Reference numeral 11 denotes a underlying interlayer insulating film, reference numeral 12 denotes a wiring material embedded in the underlying interlayer insulating film 11, and reference numeral 13 denotes an etching stopper film having a function of a stopper at the time of etching. The etching stopper film 13 is formed of, for example, SiC (silicon carbide), SiCN (silicon carbonitride), or the like.

A low dielectric constant film 20 as an interlayer insulating film is formed on the etching stopper film 13. In this example, an SiOC film is used as the low dielectric constant film 20. The SiOC film is formed by, for example, a CVD (Chemical Vapor Deposition) method using plasmarized DEMS (diethoxymethylsilane). Accordingly, the low dielectric constant film 20 contains silicon, carbon and oxygen as main components. An oxide film 14 is formed as a protective film on a surface of the low dielectric constant film 20. For example, a SiOC film is also used as the underlying interlayer insulating film 11.

In the present embodiment, a process is started in a state in which the underlying circuit portion is formed on the surface of the wafer W as shown in FIG. 1A and the low dielectric constant film 20 is formed on the underlying circuit portion. A process performed from when a via hole and a trench (groove to which a wiring is embedded) is formed in the low dielectric constant film 20 until the wiring is embedded in the trench, will be described.

First, as shown in FIG. 1B, the hard mask 22 which is an etching-purpose pattern mask made of, for example, a TiN (titanium nitride) film with a portion corresponding to the trench opened, is formed on the surface of the low dielectric constant film 20 by a well-known method.

Subsequently, an SOC film 23 is formed on the hard mask 22 and the low dielectric constant film 20 as a sacrificial film serving as a mask when etching the via hole (FIG. 1C). The SOC film 23 is a film containing carbon as a main component. For example, the SOC film 23 is formed by coating a solution of an organic film raw material containing a carbon compound on the surface of the wafer W to form an organic film, and then causing active oxygen or ozone generated by irradiating ultraviolet light in an oxygen-containing atmosphere to react with the organic film.

Figure 2B:
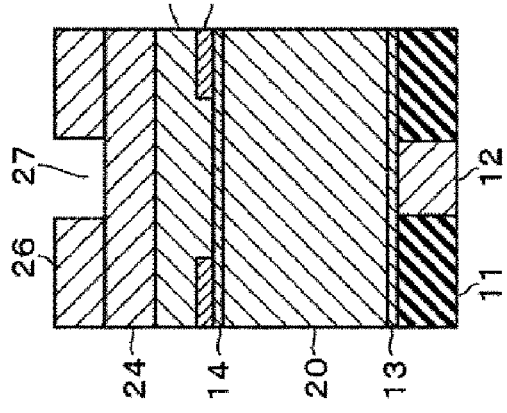
Figure 2C:
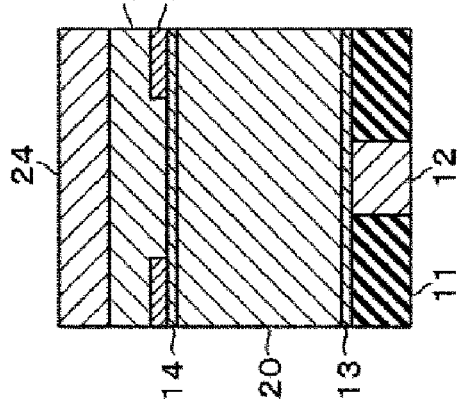

Subsequently, an antireflection film 24 using an oxide film is formed on the SOC film 23 (FIG. 2A), and a resist film 26 is formed on the antireflection film 24. Then, by exposing and developing the resist film 26, a resist pattern is formed in which an opening 27 is formed in a portion corresponding to a via hole 29 (FIG. 2B). Using the resist pattern, the antireflection film 24 is etched (FIG. 2C). When the antireflection film 24 is an $SiO_2$ film, the etching is performed by, for example, plasma obtained by plasmarizing a $CH_3F$ gas.

Subsequently, the SOC film 23 is etched to form an opening 28 in a portion corresponding to the via hole 29 (FIG. 3A). This etching may be performed by, for example, plasma obtained by plasmarizing an $O_2$ (oxygen) gas, a $CO_2$ (carbon dioxide) gas, an $NH_3$ (ammonia) gas, or a mixed has of an $N_2$ (nitrogen) gas and an $H_2$ (hydrogen) gas.

Subsequently, the low dielectric constant film 20 is etched to form the via hole 29 (FIG. 3B). A method for etching the low dielectric constant film 20, namely the SiOC film in this example, may be performed using plasma obtained by plasmarizing a processing gas, for example, a $C_6F_6$ gas. In this case, a trace amount of oxygen gas may be added. The via hole 29 is formed by being etched just in front of the etching stopper film 13 formed under the via hole 29.

Then, the SOC film 23 which is the sacrificial film exposed on the surface of the structural body is removed. At this time, if active species generated by plasmarizing an etching gas enters the via hole 29 opened toward the surface of the wafer W, the low dielectric constant film 20 may be damaged.

Therefore, in the semiconductor device manufacturing method according to this example, as shown in FIG. 4B, an embed portion 6a in which a polyurea as a polymer having a urea bond is embedded, is formed in the via hole 29. The embedding of the embed portion 6a in the via hole 29 of the structural body inhibits the entry of the etching gas. This makes it possible to suppress occurrence of damage in the low dielectric constant film 20. The embed portion 6a is formed by forming the via hole 29, forming the polyurea film 6 from above an upper surface side of the SOC film 23, and embedding the polyurea in the via hole 29 (FIG. 4A).

Referring now to FIGS. 6 to 13B, a configuration example of polyurea for forming the embed portion 6a and a film-forming method thereof will be described.

For example, polyurea may be produced by copolymerization using isocyanate and amine as shown in FIG. 6. R (substituent) is, for example, an alkyl group (linear alkyl group or cyclic alkyl group) or an aryl group, and n is an integer of 2 or more.

As the isocyanate, for example, an alicyclic compound, an aliphatic compound, an aromatic compound or the like may be used. Examples of the alicyclic compound may include 1,3-bis (isocyanate methyl) cyclohexane (H6XDI), and examples of the aliphatic compound may include hexamethylene diisocyanate. As the amine, for example, an alicyclic compound or an aliphatic compound may be used. Examples of the alicyclic compound may include 1,3-bis (aminomethyl) cyclohexane (H6XDA), and examples of the aliphatic compound may include 1,1,2-diaminododecane (DAD).

Figure 7:
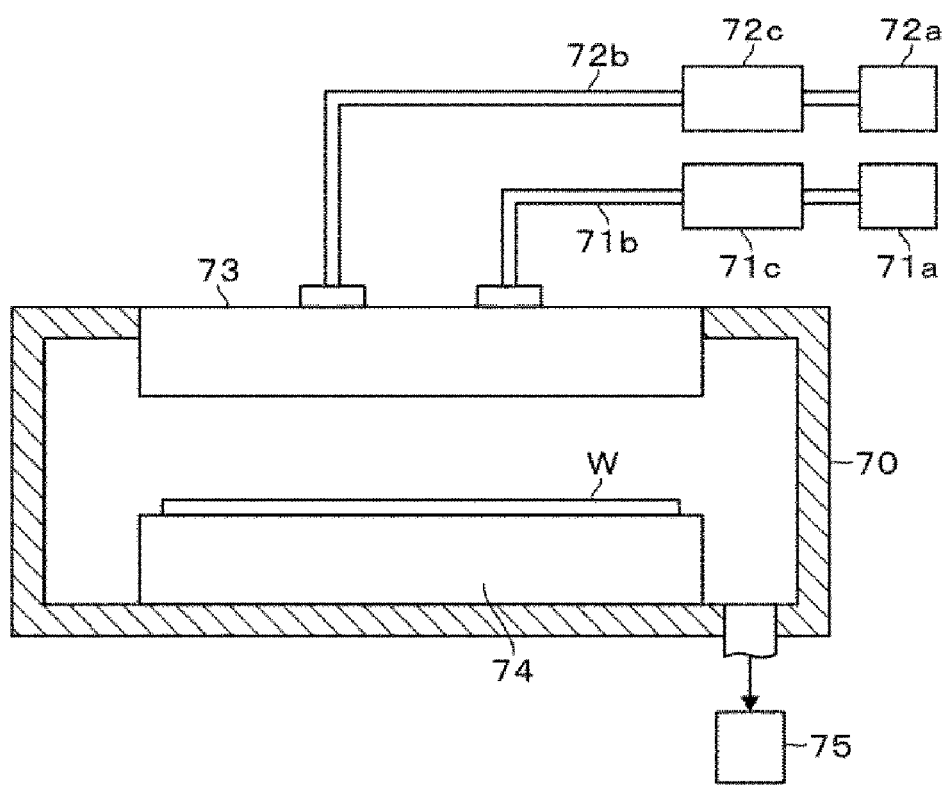
FIG. 7 is a vertical sectional side view showing an apparatus for producing a polymer having a urea bond.

FIG. 7 shows a CVD (Chemical Vapor Deposition) apparatus for reacting raw material monomers of isocyanate and amine with each other in a gaseous state to form polyurea (by vapor deposition polymerization). In FIG. 7, reference numeral 70 denotes a vacuum container in which a vacuum atmosphere is defined, and reference numeral 75 denotes an exhaust mechanism for exhausting the interior of the vacuum container 70 to form a vacuum atmosphere. Reference numerals 71a and 72a are raw material supply sources for storing isocyanate and amine as raw material monomers in a liquid state.

An isocyanate liquid and an amine liquid are vaporized by vaporizers 71c and 72c installed in supply pipes 71b and 72b. The respective vapors are introduced into a shower head 73 which is a gas discharge part. A large number of discharge holes are formed in a lower surface of the shower head 73. The shower head 73 is configured to discharge the isocyanate vapor and the amine vapor from individual discharge holes into the vacuum container 70 which is kept in a processing atmosphere.

A mounting table 74 having a mounting surface, which is disposed to face the lower surface of the shower head 73 having the large number of discharge holes, is installed below the shower head 73. A temperature control mechanism (not shown) is provided inside the mounting table 74. The wafer W on which the above-described structural body is formed is mounted on the mounting surface of the mounting table 74.

As an example of a method of forming the polyurea film 6 on the surface of the wafer W using the CVD apparatus configured as above, it may be possible to employ a method of alternately supplying an isocyanate vapor and an amine vapor into the vacuum container 70 in which the wafer W is mounted on the mounting table 74. In some embodiments, it may also be possible to use a method which includes stopping the supply of the isocyanate vapor, evacuating the interior of the vacuum container 70 followed by supplying the amine vapor, and subsequently, stopping the supply of the amine vapor, evacuating the interior of the vacuum container 70 followed by supplying the isocyanate vapor. Alternatively, it may also be possible to adopt a method which includes stopping the supply of one of the vapors followed by supplying the other vapor, and subsequently, stopping the supply of the other vapor followed by supplying one of the vapors. Alternatively, it may be possible to use a method of simultaneously supplying the isocyanate vapor and the amine vapor into the vacuum container 70.

Figure 8:
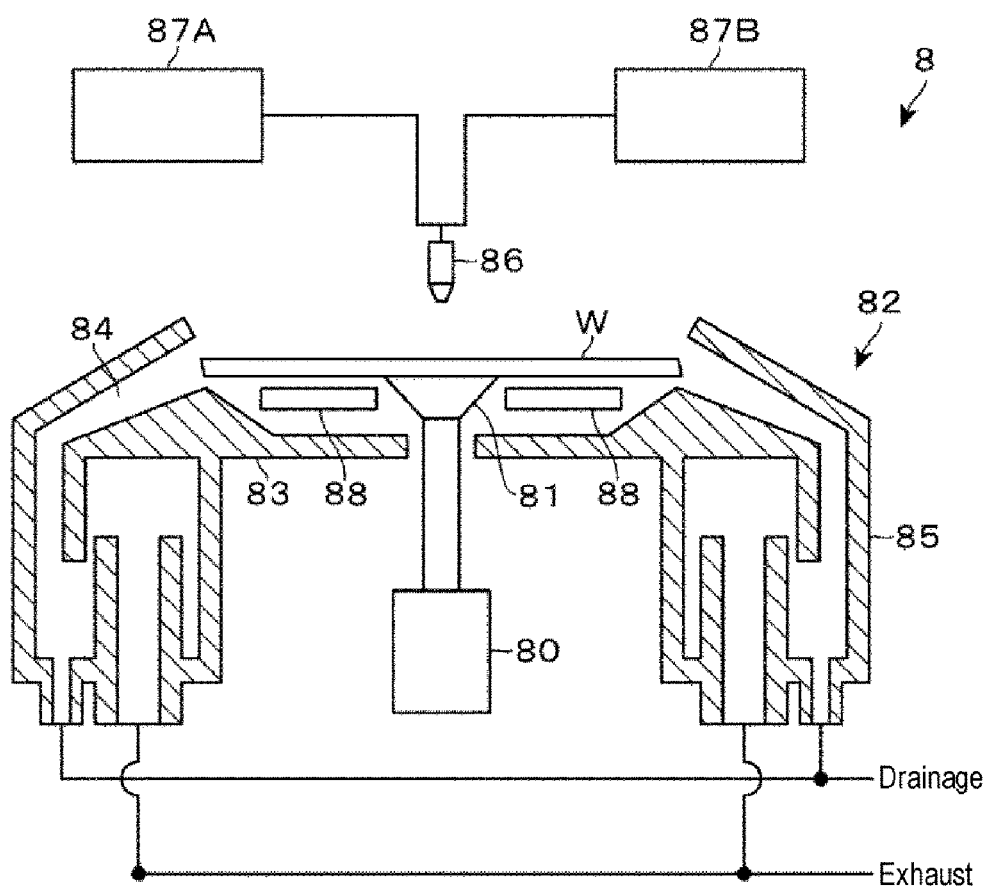
FIG. 8 is a vertical sectional view showing another apparatus for producing a polymer having a urea bond.
Figure 9A:
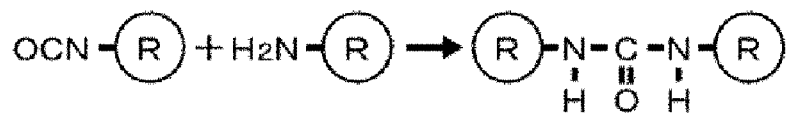
FIGS. 9A to 9D are explanatory views showing reactions in which a polymer having a urea bond becomes an oligomer.
Figure 9B:
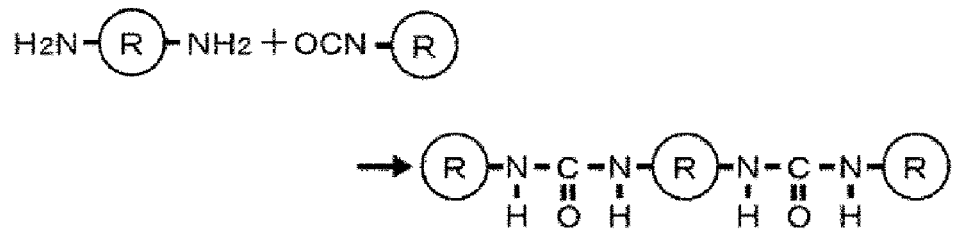
Figure 9C:
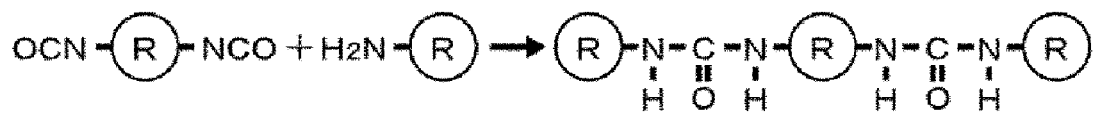
Figure 9D:
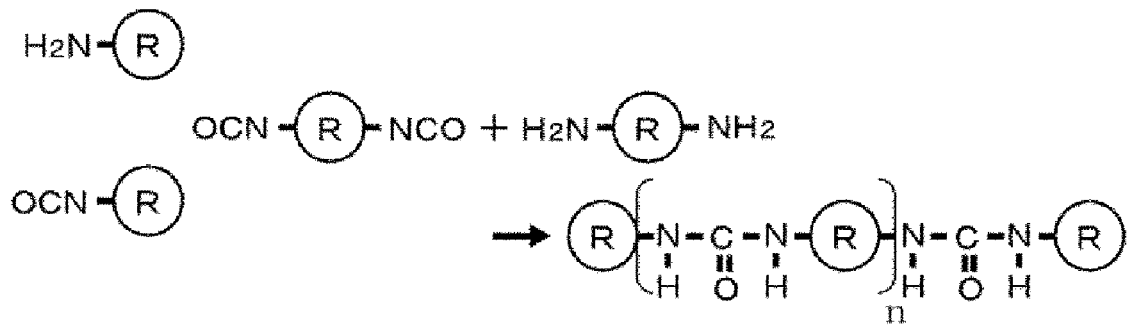

As another method of forming the polyurea film 6 on the surface of the wafer W, it may be possible to use a coating film-forming apparatus 8 that supplies an isocyanate-containing solution and an amine-containing solution to the wafer W to perform film formation (FIG. 8). In FIG. 8, reference numeral 81 denotes a vacuum chuck which is a mounting table configured to adsorptively hold the wafer W and be rotated by a rotation mechanism 80, reference numeral 82 denotes a cup module, and reference numeral 83 denotes a guide member in which an outer peripheral wall and an inner peripheral wall extending downward are formed in a cylindrical shape. Reference numeral 84 denotes a discharge space formed between an outer cup 85 and the outer peripheral wall so that exhaust and drainage can be performed over the entire circumference. A structure capable of gas-liquid separation is formed below the discharge space 84. In the figure, reference numeral 88 denotes an LED (light emitting diode) for heating the wafer W, for example, by irradiating the wafer W with light from below. The LED 88 heats the wafer W so that polymerization occurs when a chemical solution is supplied to the wafer W as will be described later.

A solution of amine (referred to as a first chemical solution) is supplied from a supply source 87B to a chemical solution nozzle 86, and a solution of isocyanate (referred to as a second chemical solution) is supplied from a supply source 87A to the chemical solution nozzle 86. These solutions are joined with each other immediately before being supplied to the chemical solution nozzle 86, thereby forming a mixed solution. That is to say, the first chemical solution and the second chemical solution are mixed just before being supplied to the substrate. Then, the chemical solution nozzle 86 discharges the mixed solution vertically downward. The chemical solution nozzle 86, which is a raw material discharge part, is connected to a driving mechanism (not shown) and is configured to be movable between above the central portion of the wafer W and the outside of the outer cup 85.

The process of the wafer W in the coating film-forming apparatus 8 will be described. First, the mixed solution is supplied to the central portion of the wafer W from the chemical solution nozzle 86 that constitutes a raw material discharge part. The wafer W is rotated at a predetermined number of revolutions so that the mixed solution is spread on the surface of the wafer W. That is to say, the first chemical solution and the second chemical solution are respectively spin-coated on the wafer W. Then, the polyurea film 23 is formed by the mixed solution on the surface of the wafer W heated by the LED 88.

The film formation may be performed by initially supplying one of the first chemical solution and the second chemical solution to the wafer W and then supplying the other chemical solution. In that case, a chemical solution nozzle for amine, which is connected to the supply source 87B, and a chemical solution nozzle for isocyanate, which is connected to the supply source 87A, are separately provided so that the chemical solutions are discharged from the chemical solution nozzles to the wafer W. Meanwhile, each of the chemical solution nozzles may be configured to discharge the chemical solution supplied from the respective supply source onto the wafer W in a mist state. When supplying the mist to the wafer W, the wafer W may not be rotated and may be kept in a stopped state.

Figure 10A:
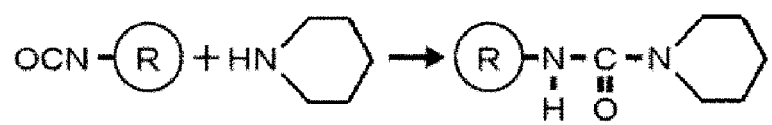
FIGS. 10A and 10B are explanatory views showing how a polymer having a urea bond is produced by using a secondary amine.
Figure 10B:
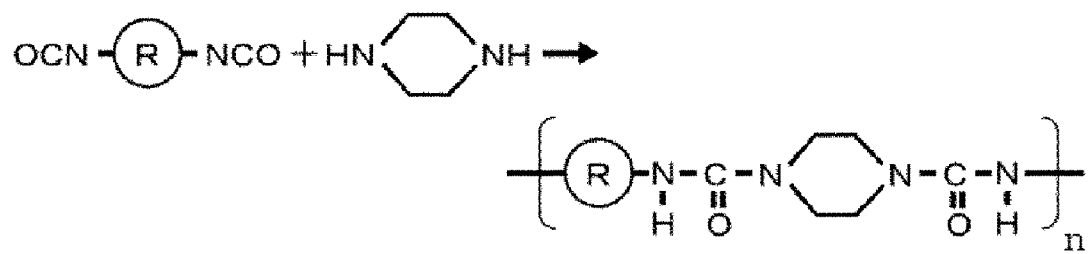

Next, variations of the reaction between isocyanate and amine will be described. In this reaction, as shown in FIGS. 9A to 9D, mono-functional molecules may be used as raw material monomers. Furthermore, as shown in FIGS. 10A and 10B, isocyanate and secondary amine may be used. A bond contained in the polymer produced in this case is a urea bond.

Figure 11:
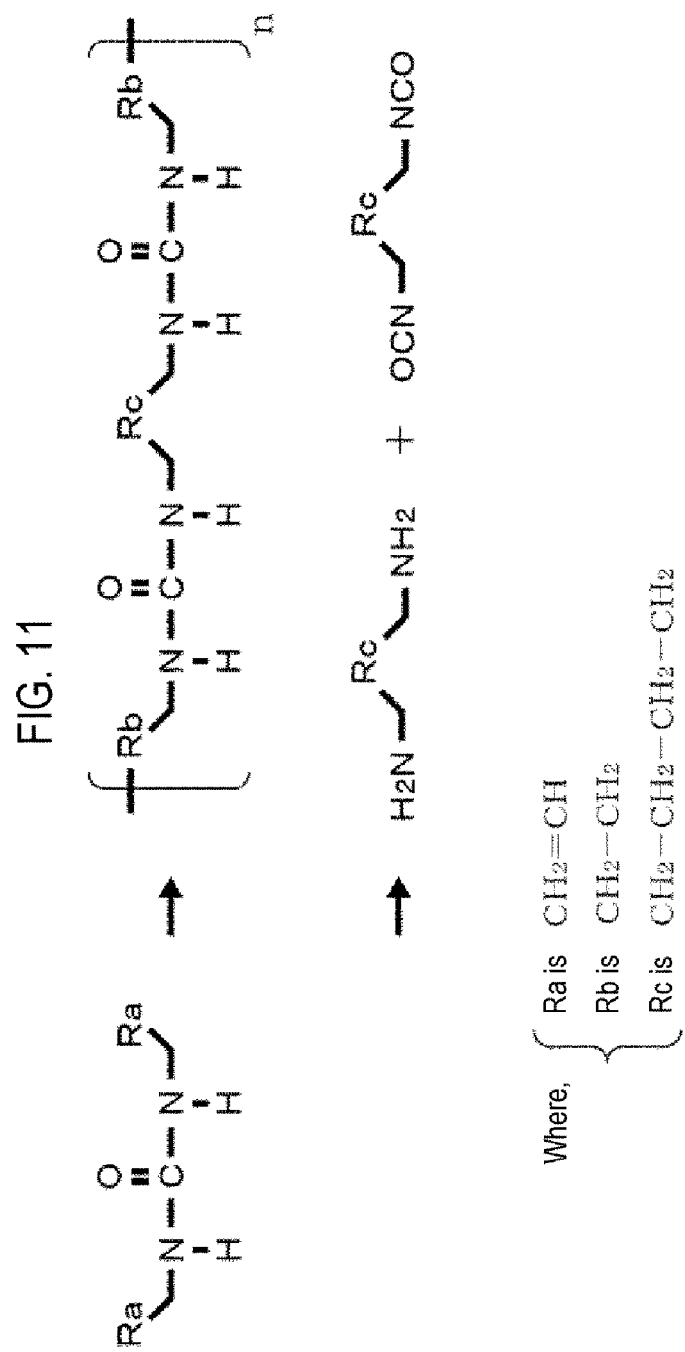
FIG. 11 is an explanatory view showing how a polymer having a urea bond is produced by cross-linking monomers having a urea bond.

Then, the raw material monomers having a urea bond may be polymerized to obtain the polyurea film 6. FIG. 11 shows such an example in which polymerization occurs to produce the polyurea film 6 by irradiating the raw material monomers with light, for example, ultraviolet rays to give light energy thereto.

Figure 12A:
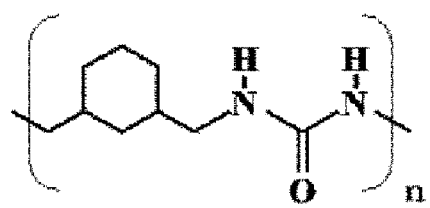
FIGS. 12A to 12C are explanatory views showing examples of a skeleton structure of a polymer.
Figure 12B:
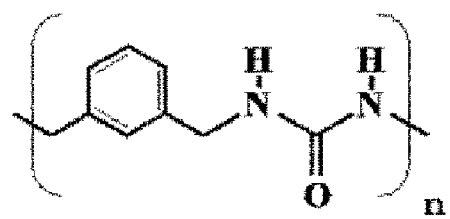
Figure 12C:
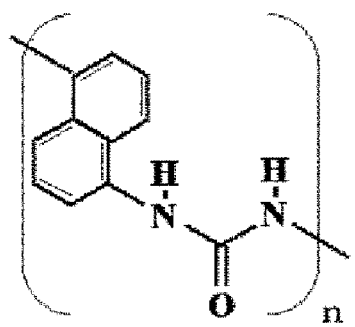

FIGS. 12A to 12C show examples of a skeleton structure of polyurea. By selecting various molecular structures of a substituent (R) of isocyanate or amine, as shown in each figure, it is possible to freely change a content ratio of carbon (C), hydrogen (H), oxygen (O) and nitrogen (N) in the skeleton structure of polyurea (mass % is shown in FIGS. 12A to 12C).

It is generally known that a polymer has a higher etching resistance to dry etching and wet etching as the carbon content ratio grows larger. Therefore, by appropriately adjusting the skeleton structure adopted as the polyurea film 6, it is possible to design a polyurea having low reactivity to an etchant for etching the hard mask 22 (a hard-to-etch polyurea).

Figure 13A:
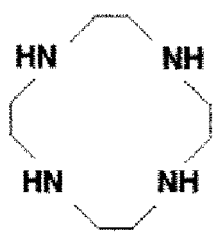
FIGS. 13A and 13B are explanatory views showing examples of amine capable of forming a three-dimensional cross-linked structure.
Figure 13B:
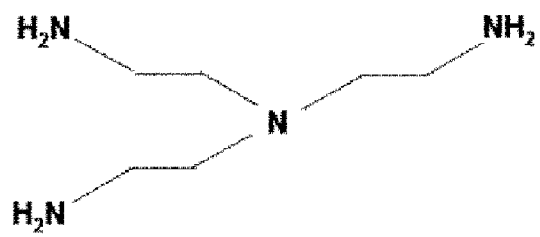

Further, by using a cyclic amine shown in FIG. 13A or an amine having sensitivity of three or more shown in FIG. 13B, it is also possible to form a three-dimensionally cross-linkable polyurea. Since the polyurea of this type is low in reactivity to an etchant (less likely to be etched), the polyurea has physical properties suitable for protecting the structural body when removing the hard mask 22.

In addition, isocyanate (liquid), which is a self-polymerization raw material, may be supplied to a substrate, and subsequently, moisture, for example, a water vapor may be supplied to the substrate. If isocyanate is reacted with moisture, the isocyanate is hydrolyzed to immediately produce polyurea.

Returning to the explanation of FIGS. 4A to 4C, on the structural body (the wafer W) after formation of the via hole 29, the polyurea film 6 is formed by using, for example, the CVD apparatus shown in FIG. 7 or the coating film-forming apparatus 8 shown in FIG. 8. The vapor or solution of isocyanate and amine also enters the via hole 29 as a recess and reacts with each other therein. It is therefore possible to form the polyurea film 6 in a state in which the polyurea is embedded in the via hole 29 (FIG. 4A).

The entire surface of the wafer W after formation of the polyurea film is covered with the polyurea film 6. Thus, it is impossible to etch the SOC film 23. Therefore, it is necessary to perform a process of removing the polyurea film 6 existing in a region other than the portion embedded in the via hole 29 and exposing the hard mask 22.

In the case of polyurea, by changing the temperature environment, it is possible to reversibly perform a polymerization reaction for producing polyurea from isocyanate and amine monomers and a depolymerization reaction for producing these monomers from polyurea. In the polyurea, a reversible equilibrium reaction between polymerization and depolymerization is established. Depolymerization is dominant as a temperature rises. For example, at 300 degrees C. or higher, the equilibrium is biased toward the depolymerization side. In this temperature environment, the monomers produced by depolymerization are vaporized. A film thickness of the polyurea film 6 decreases with time, and ultimately, the polyurea film 6 is eliminated in its entirety. The time required for the polyurea film 6 to be eliminated by depolymerization becomes shorter as the environmental temperature grows higher.

Therefore, the wafer W is heated to the above-mentioned 300 degrees C. or higher, for example, 350 degrees C. Then, the heating is stopped at the timing when the polyurea film 6 covering the SOC film 23 is removed and the embed portion 6a made of polyurea remains in the via hole 29 and the trench 291 (FIG. 4B). The heating temperature and the heating time may be determined by preliminary experiments and the like. Polyurea is depolymerized into amine and is evaporated. In order not to adversely affect an element portion already formed on the wafer W, particularly a copper wiring constituting the wiring material 12, the wafer W may be heated at 400 degrees C. or less, specifically 390 degrees C. or less, and more specifically, 300 degrees C. to 350 degrees C.

Figure 14:
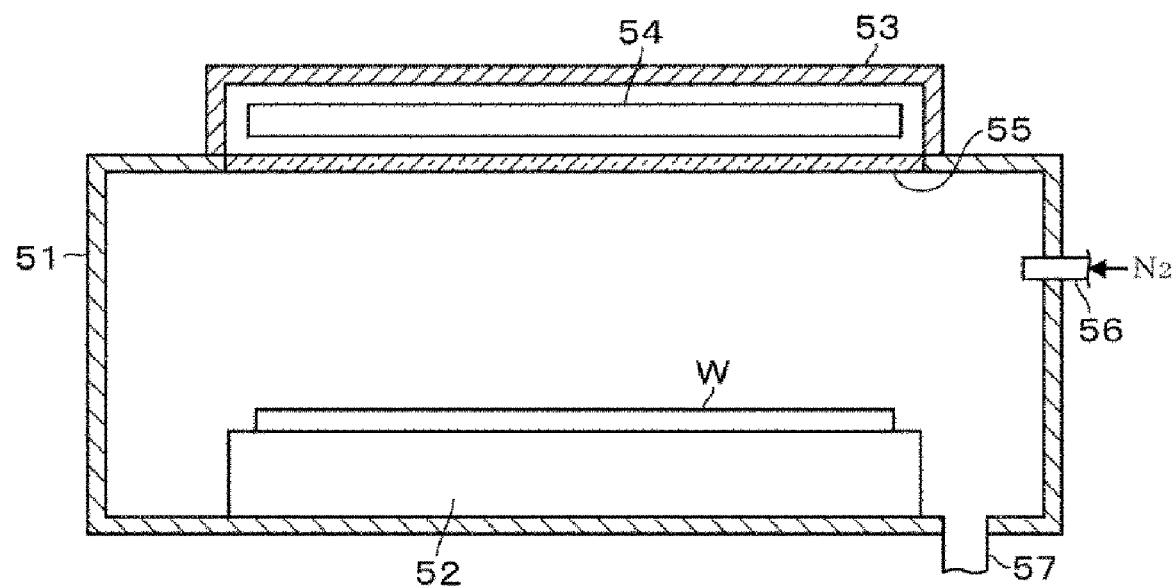
FIG. 14 is a vertical sectional side view showing a heating apparatus for heating a wafer on which a polyurea film is formed.

For example, as shown in FIG. 14, the process of heating the wafer W may be performed by mounting the wafer W on a mounting table 52 inside a process container 51 and irradiating infrared rays onto the wafer W from an infrared lamp 54 inside a lamp house 53. In FIG. 14, reference numeral 55 denotes a transmission window through which the infrared rays are transmitted, reference numeral 56 denotes a supply pipe for supplying a nitrogen gas, and reference numeral 57 denotes an exhaust pipe for exhausting the interior of the process container 51. A process may be performed in, for example, a vacuum atmosphere while supplying the nitrogen gas as an inert gas (in which case a vacuum exhaust mechanism is connected to the exhaust pipe 57 and a vacuum container is used as the process container 51), or may be performed in a normal pressure atmosphere. A heating mechanism for heating the wafer W is not limited to the infrared lamp 54, and may be a heater provided in the mounting table 52.

A period of time during which polyurea is depolymerized, for example, a heating time during which the wafer W is heated at 300 degrees C. to 400 degrees C., may be set to, for example, 5 minutes or less, from the viewpoint of suppressing thermal damage to the element. Accordingly, a specific example of a heating recipe may be 350 degrees C. and 5 minutes or less. The heating atmosphere is, for example, an inert gas atmosphere such as a nitrogen gas atmosphere or the like.

After exposing the SOC film 23 by the above-described process, the SOC film 23 and the polyurea embedded in the opening 28 of the SOC film 23 are removed by the same plasma as used at the time of forming the opening 28 of FIG. 3A, for example, $O_2$ gas plasma (FIG. 4C). Since the embed portion 6a remains in the via hole 29, it is possible to prevent the plasma from entering the via hole 29 during the etching of the SOC film 23 having a relatively thick thickness and to suppress damage of the low dielectric constant film 20.

It is necessary that each process (the plasma etching of the SOC film 23 in this example) performed until this stage after the formation of the polyurea film 6 is performed at a temperature lower than the temperature at which the polyurea is depolymerized. For example, the processing temperature of the wafer W when etching the film is, for example, 100 degrees C. or less. In the case where a film is formed by CVD or ALD, the processing temperature of the wafer W may be, for example, from room temperature to 200 degrees C.

Thereafter, by heating the wafer W again, the polyurea constituting the embed portion 6a is depolymerized and is removed from the interior of the via hole 29 (FIG. 5A). The removal of the embed portion 6a only by heating has less influence on the low dielectric constant film 20 and the copper wiring 12 as compared with the case of using the etchant. From this viewpoint, it is possible to suppress damage to the low dielectric constant film 20, the copper wiring 12, or the like even at the time of removing the embed portion 6a.

The removal of the embed portion 6a is not limited to the case where a method of depolymerizing polyurea by a heating process is adopted. An etchant which has little damage to the low dielectric constant film 20 or the copper wiring 12 constituting the structural body and exposed toward the via hole 29 and the trench 291, and which can react with polyurea to remove the same may be selected to remove the embed portion 6a by dry etching or wet etching.

As shown in the experimental results of the examples described later, in the case of using an etching solution, there may be exemplified a method of removing the embed portion 6a by using SC2 (a mixed solution of hydrochloric acid, hydrogen peroxide solution and water), SPM (a mixed solution of sulfuric acid, hydrogen peroxide solution and water), NMP (N-methylpyrrolidone), a mixed solution of hydrofluoric acid (HF) and nitric acid ($HNO_3$). As another method, for example, when the damage to the low dielectric constant film 20 and the copper wiring 12 is small, it may be possible to adopt a method of ashing and removing the polyurea in the embed portion 6a with an activated gas obtained by plasmarizing an etching gas containing oxygen.

Subsequently, anisotropic etching of the low dielectric constant film 20 is performed by plasma of a CF-based gas, for example, the aforementioned plasma of the $C_6F_6$ gas, by using the hard mask 22 exposed by removing the SOC film 23 as a mask. By this etching, the trench 291 is formed. The via hole 29 is dug until reaching the etching stopper film 13 (FIG. 5B).

Thereafter, the etching stopper film 13 is removed to expose the wiring material 12 (FIG. 5C). For example, the etching stopper film 13 made of SiC may be removed by plasma of a fluorine-based gas such as a hydrogen fluoride gas or the like.

Subsequently, the hard mask 22 is removed by SPM. A barrier layer formed of, for example, a laminated film of Ti and TiON, for preventing copper, which constitutes a conductive path of a semiconductor device, from diffusing into the low dielectric constant film 20 is formed on inner surfaces of the via hole 29 and the trench 291. Thereafter, copper is embedded in the via hole 29 and the trench 291. The excess copper and the excess barrier layer are removed by CMP (Chemical Mechanical Polishing) to form a copper wiring (conductive path). Illustration of the formation of the barrier layer and the formation of the copper wiring is omitted.

The semiconductor device manufacturing method according to the present embodiment provides the following effects. The polyurea having a urea bond is embedded in the via hole 29. The SOC film 23 as a sacrificial film is removed in a state in which the embed portion 6a is formed. Since the polyurea can be relatively easily removed by a heating process or the like, it is possible to remove the embed portion 6a while suppressing occurrence of damage to a semiconductor device.

Second Embodiment

Next, in a process of manufacturing a DRAM (Dynamic Random Access Memory), a technique of using the polyurea film 6 made of polyurea when forming a relatively deep recess in an $SiO_2$ (silicon oxide) film that constitutes a structural body for forming a capacitor, will be described with reference to FIGS. 15A to 17B.

In the structural body for forming the capacitor of DRAM shown in FIG. 15A, an $SiO_2$ film 32 having a thickness of about 1 μm is laminated on a tungsten layer 31. An a-Si (amorphous silicon) film 33 having a thickness of about 300 nm is laminated on the $SiO_2$ film 32.

Subsequently, a resist film 34 is laminated on the structural body (FIG. 15B). The a-Si film 33 is patterned by a plasma etching using, for example, a fluorine-based etching gas such as $C_4F_6$ (hexafluorobutadiene), $C_4F_8$ (octafluorobutene) or the like (FIG. 15C).

Then, after removing the resist film 34, the $SiO_2$ film 32 is etched by the plasma etching using the above-described fluorine-based etching gas to form a recess 301 (FIG. 15D). As compared with the a-Si film 33, the $SiO_2$ film 32 has a high selectivity to the fluorine-based etching gas. Therefore, it is possible to deeply form the recess 301 by using the patterned a-Si film 33 as a mask. The recess 301 has a hole diameter or groove width of, for example, 80 nm in diameter×2 μm in depth.

Figures 16A, 16B, 16C, 16D:
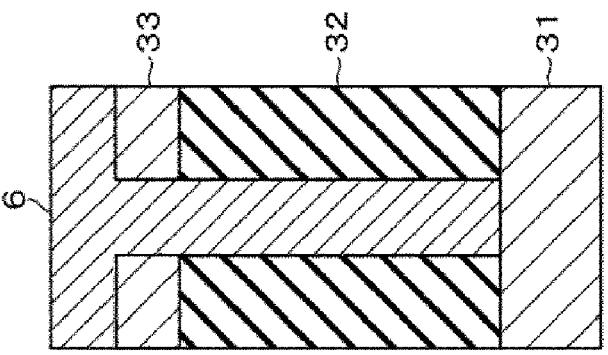
FIGS. 16A to 16D are second explanatory views showing the semiconductor device manufacturing method according to the second embodiment.

Subsequently, the a-Si film 33 used as a mask is removed by, for example, a TMAH aqueous solution which is an alkaline etching solution. At this time, in order to prevent the $SiO_2$ film 32 exposed toward the recess 301 from being damaged due to the contact with the etching solution, a polyurea film 6 is formed on the a-Si film 33, and polyurea is embedded in the recess 301 (FIG. 16A). The film formation method and composition of the polyurea film 6 are the same as those described in the first embodiment. Therefore, the description thereof will be omitted.

Figure 17A:
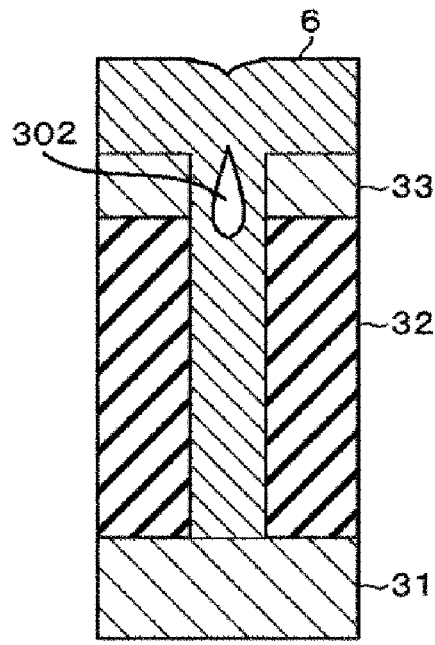
FIGS. 17A and 17B are explanatory views showing an operation of forming a polymer film in accordance with the second embodiment.

As separately shown in FIG. 17A, when the polyurea film 6 is formed in a structural body in which the recess 301 having a large aspect ratio and a smaller opening area compared with a depth is formed, the entrance of the recess 301 may be blocked before the polyurea film 6 is completely embedded in the recess 301. In this case, a cavity 302 called a seam is formed in the recess 301. In addition, a depression is formed in the surface of the polyurea film 6 at a position corresponding to the recess 301.

Figure 17B:
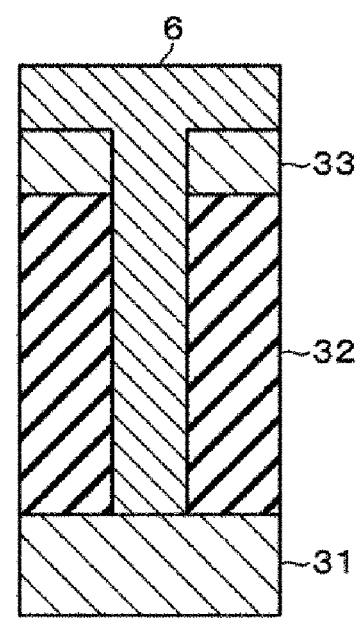

If such a cavity 302 is likely to be formed, the wafer W on which the polyurea film 6 has been formed is heated to, for example, 280 degrees C. to depolymerize a portion of the polyurea film 6. The portion of polyurea thus depolymerized may have fluidity. Therefore, by allowing polyurea having fluidity to enter the cavity 302, the cavity 302 is filled with the polyurea so that the surface of the polyurea film 6 is made flat (FIG. 17B).

Thereafter, the heating of the wafer W is stopped and the cooling of the wafer W is performed, thereby obtaining a structural body in which polyurea is embedded in the recess 301 (FIG. 16A). At this time, the film thickness of the polyurea film 6 also decreases due to depolymerization. Increasing the heating temperature shortens the time required for embedment. However, the rate of film reduction from the surface of the polyurea film 6 attributable to depolymerization also increases. As a result, it becomes difficult to finely adjust the film thickness. Thus, the heating temperature and the heating time are set according to the film thickness at the time of forming the polyurea film 6, the adjustment amount of the film thickness, and the like.

Upon completing the formation of the polyurea film 6, the wafer W is heated in the same manner as in the first embodiment, whereby the polyurea film 6 on the surface of the wafer W can be removed while leaving the embed portion 6a and exposing the a-Si film 33 (FIG. 16B).

When the wafer W is heated, the polyurea film 6 covering the a-Si film 33 is removed, and the recess 301 is filled with the embed portion 6a, the a-Si film 33 is removed by the etching using the aforementioned TMAH aqueous solution (FIG. 16C). As shown by experimental results in reference examples described later, the polyurea has smaller reactivity with the TMAH aqueous solution than the a-Si film 33. Thereafter, the wafer W is heated again to depolymerize the polyurea constituting the embed portion 6a, and the embed portion 6a is removed from the interior of the recess 301 (FIG. 16D).

For example, in a case where the embed portion 6a is formed using an organic film, there is required a process of plasmarizing an etching gas containing oxygen to remove the embed portion 6a. As a result, if the tungsten layer 31 exposed on the bottom surface of the recess 301 is oxidized, the resultant oxide need to be removed using dilute hydrofluoric acid or the like. However, the dilute hydrofluoric acid also causes damage to the $SiO_2$ film 32 exposed on the side wall surface of the recess 301. In this regard, since the embed portion 6a made of polyurea can be relatively easily removed by a heating process or the like, it is possible to remove the embed portion 6a while suppressing damage to the structural body (semiconductor device) exposed toward the recess 301.

Third Embodiment

Figure 18:
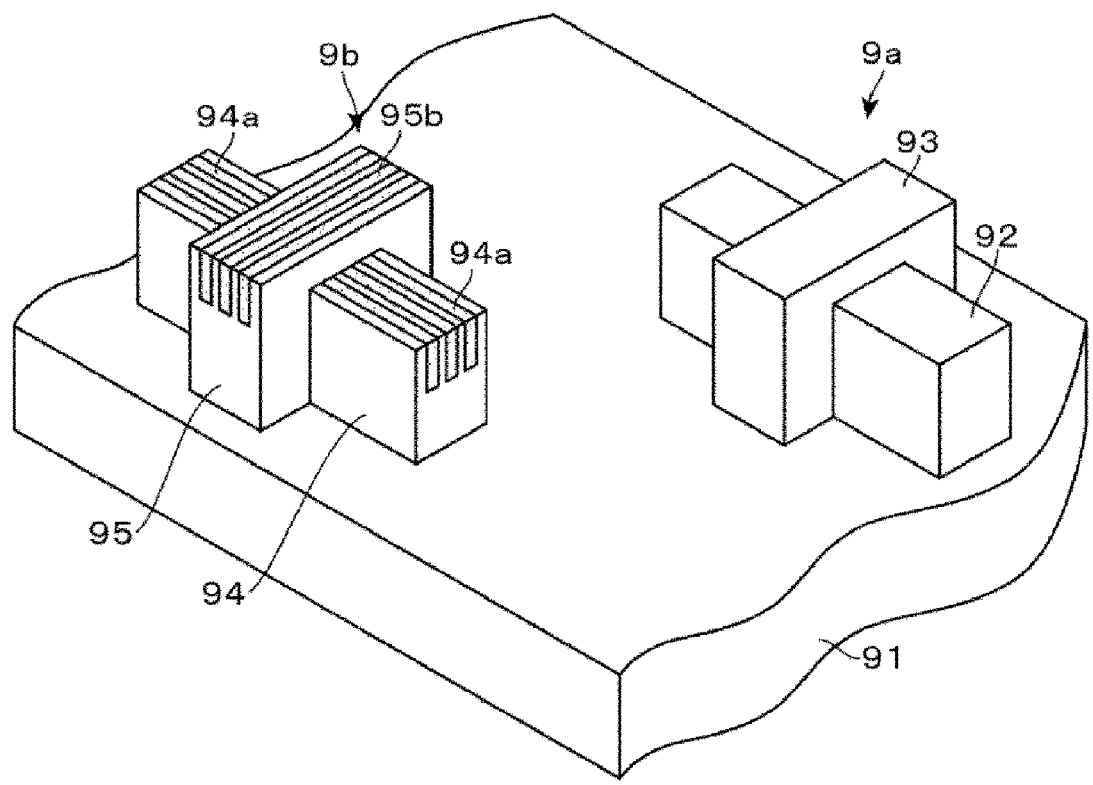
FIG. 18 shows a structural body in the course of manufacturing a fin-type FET to which a semiconductor device manufacturing method according to a third embodiment is applied.

FIGS. 18 to 21I show an example in which the embed portion 6a made of polyurea is used for removing a mask during an ion implantation process. In FIG. 18, reference numeral 9a denotes a structural body in the course of manufacturing a fin-shaped FET formed on a substrate 91, and reference numeral 9b denotes a structural body in the course of manufacturing a fin-type semiconductor device.

Further, reference numeral 92 in FIG. 18 denotes a silicon layer which is a fin. Reference numeral 93 denotes a rectangular gate which covers a longitudinal central portion of the silicon layer 92 and extends in a direction perpendicular to the silicon layer 92. Reference numeral 94 denotes a silicon layer which is a fin. Reference numeral 95 denotes a silicon layer which covers a longitudinal central portion of the silicon layer 94 and extends in a direction perpendicular to the silicon layer 94. Grooves 94a and 95a are formed in the silicon layers 94 and 95, respectively. In FIG. 18, although the grooves 94a and 95a have not yet been buried, dots are added in order to facilitate grasping of the structure. The groove 94a has a groove width of, for example, 10 to 100 nm and an aspect ratio of, for example, 2 or more.

Figure 19A:
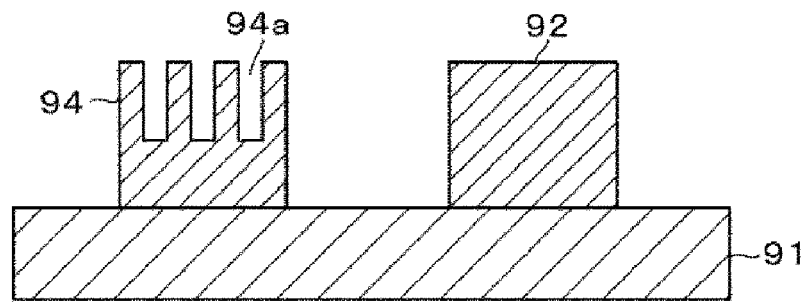
FIGS. 19A to 19C are first explanatory views showing the semiconductor device manufacturing method according to the third embodiment.
Figure 19B:
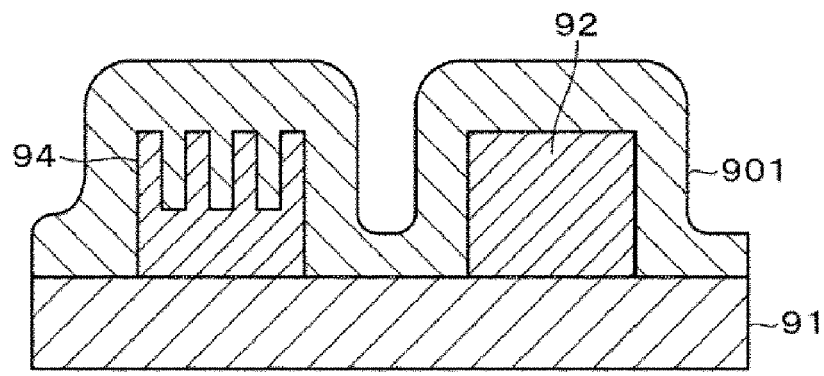

A specific example utilizing the polyurea film 6 in a process of implanting, for example, P-type impurities to an upper surface of one side portion of the fin 92 of the structural body 9a by ion implantation will be described with reference to FIGS. 19A to 21I. FIG. 19A shows the state of a surface portion of the substrate 91 before performing a film-forming process of a mask 901 which is a sacrificial film. First, the mask 901 formed of, for example, a SiOC (carbon- and oxygen-containing silicon oxide) film, a SiN (silicon nitride) film, a $SiO_2$ (silicon oxide) film, or the like is formed on the substrate 91 (FIG. 19B).

Figure 19C:
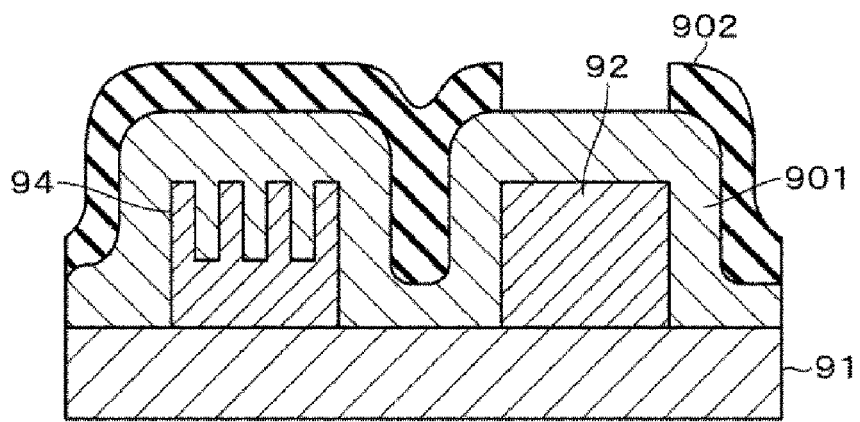
Figure 20A:
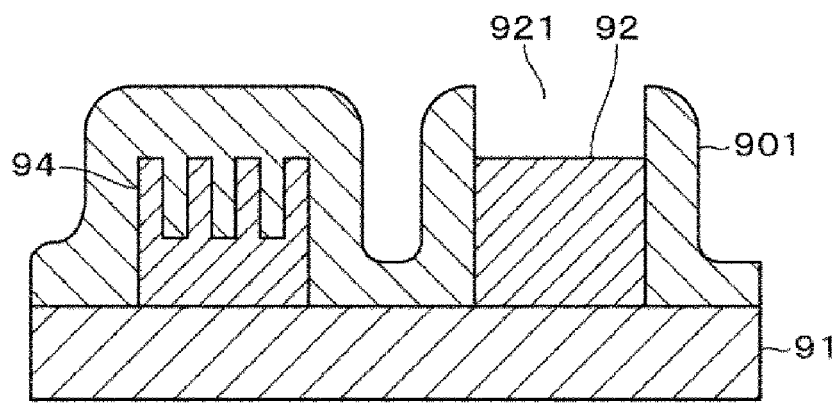
FIGS. 20A to 20C are second explanatory views showing the semiconductor device manufacturing method according to the third embodiment.

Thereafter, a resist film 902 is formed on the mask 901 to etch a portion to be ion-implanted. A patterning process is performed so as to form an opening at the position where the ion implantation is performed (FIG. 19C). Then, the mask 901 is removed through the opening of the resist film 902 to form an opening 921 which is a recess. After the region where the ion implantation is performed is exposed through the opening 921, the resist film 902 is removed (FIG. 20A).

Figure 20B:
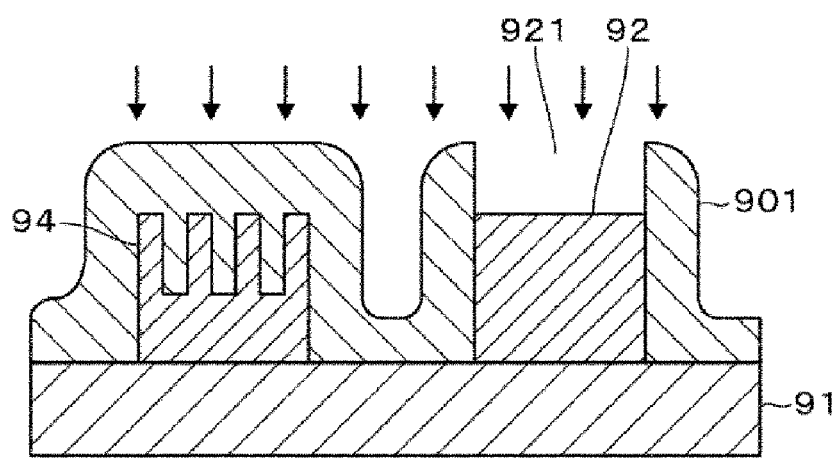
Figure 20C:
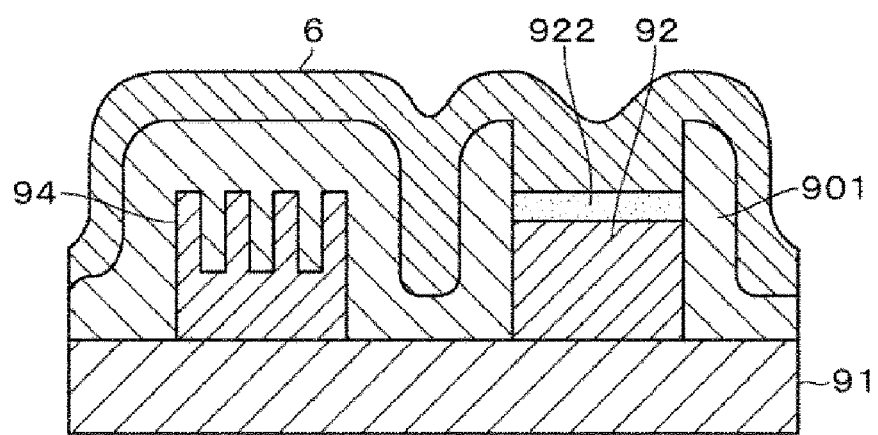

Subsequently, the ion implantation is performed on the exposed region (FIG. 20B). Thereafter, a polyurea film 6 for protecting an impurity region 922 as the ion-implanted region when removing the mask 901 is formed (FIG. 20C). The film formation method and composition of the polyurea film 6 are the same as those described in the first embodiment. Therefore, the description thereof will be omitted.

Figure 21A:
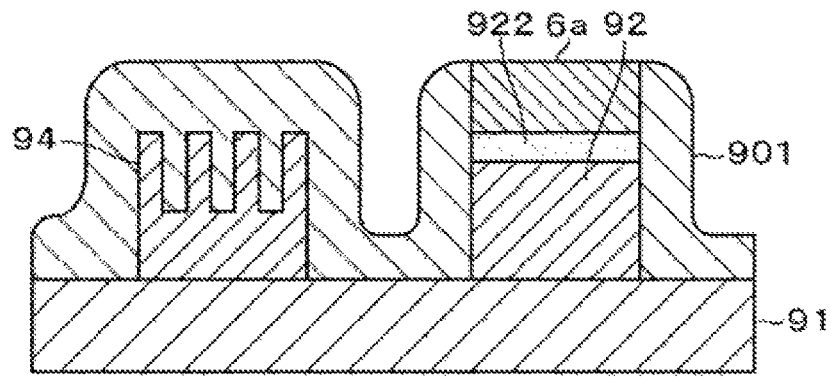
FIGS. 21A to 21C are third explanatory views showing the semiconductor device manufacturing method according to the third embodiment.

Upon completing the formation of the polyurea film 6, the wafer W is heated in the same manner as the example described in the first embodiment, whereby the polyurea film 6 on the surface of the substrate 91 can be removed while leaving the embed portion 6a formed in the opening 921, and exposing the mask 901 (FIG. 21A).

Figure 21B:
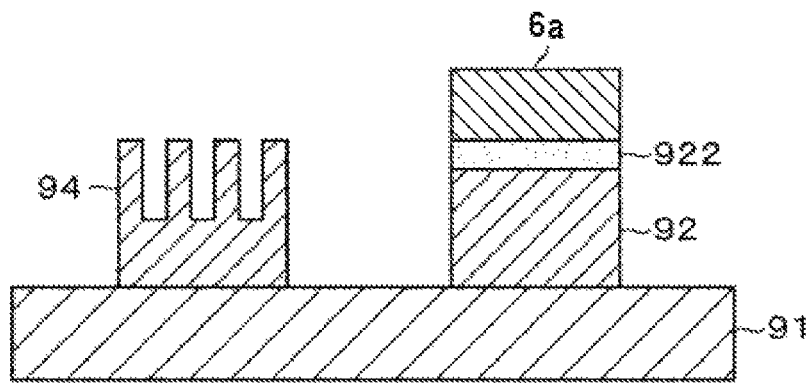
Figure 21C:
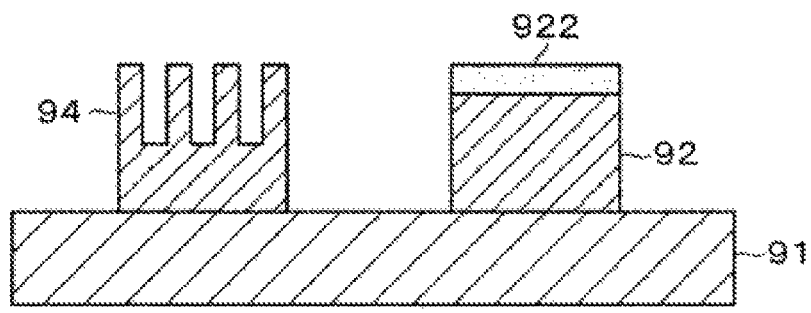

When the polyurea film 6 covering the mask 901 is removed and the embed portion 6a remains in the opening of the mask 901, the mask 901 is removed by an etching solution suitable for etching the film material constituting the mask 901 (FIG. 21B). Thereafter, the substrate 91 is heated again to depolymerize the polyurea constituting the embed portion 6a, thereby removing the embed portion 6a from the upper surface of the impurity region 922 (FIG. 21C).

Even in this example, the embed portion 6a made of polyurea is used for protecting the impurity region 922 when removing the mask 901. Thereafter, the embed portion 6a made of polyurea can be relatively easily removed by a heating process or the like while suppressing the occurrence of damage to the impurity region 922.

EXAMPLES (Reference Experiment)

Various chemical solutions were supplied to the polyurea film 6 to investigate the removal status of the polyurea film 6.

A. Experimental Conditions

The polyurea film 6 having a film thickness of 150 nm was formed on the surface of a silicon-made sample substrate having a skeleton structure shown in FIG. 12A. The sample substrate was immersed in various chemical solutions to investigate a reduction rate of the film thickness of the polyurea film 6. Unless specifically mentioned in the description of each reference example, a temperature of the chemical solutions was room temperature (23 degrees C.), and the immersion time of the sample substrate was 300 seconds.

Reference Example 1

A test was conducted by immersing a sample in SC1 obtained by mixing aqueous ammonia ($NH_3$: 28 wt %), hydrogen peroxide solution ($H_2O_2$: 30 wt %) and water ($H_2O$). The mixing ratio of the raw material liquids is $NH_3:H_2O_2:H_2O=1:2:7$. The immersion time of the sample is 600 seconds.

Reference Example 2

A test was conducted by immersing a sample in SC2 obtained by mixing aqueous hydrochloric acid solution (HCl: 35 wt %), hydrogen peroxide solution ($H_2O_2$: 30 wt %) and water ($H_2O$). The mixing ratio of the raw material liquids is $HCl:H_2O_2:H_2O=1:1:7$. The immersion time of the sample is 600 seconds.

Reference Example 3

A test was conducted by immersing a sample in SPM obtained by mixing sulfuric acid ($H_2SO_4$: 98 wt %) and hydrogen peroxide solution ($H_2O_2$: 30 wt %). The mixing ratio of the raw material liquids is $H_2SO_4:H_2O_2=1:4$.

Reference Example 4

A test was conducted by immersing a sample in a resist developer NMD-3 (a product of Tokyo Ohka Kogyo Co., Ltd. having a TMAH (tetramethyl ammonium hydroxide) concentration of 0.25 to 5 wt %).

Reference Example 5

A test was conducted by immersing a sample in a solvent, IPA (isopropyl alcohol). The immersion time of the sample is 600 seconds.

Reference Example 6

A test was conducted by immersing a sample in acetone as a solvent. The immersion time of the sample is 600 seconds.

Reference Example 7

A test was conducted by immersing a sample in NMP (N-methyl-2-pyrrolidone) as a solvent. The immersion time of the sample is 600 seconds.

Reference Example 8

A test was conducted by immersing a sample in a copper sulfate solution ($CuSO_4$: 125 g, $H_2SO_4$ (98 wt %): 25 cc, $H_2O$: 500 cc). The immersion time of the sample is 600 seconds.

Reference Example 9

A test was conducted by immersing a sample in an aqueous citric acid solution (diluting 50 g/L aqueous citric acid solution with $H_2O$, $H_2O$:aqueous citric acid solution=1:20).

Reference Example 10

A test was conducted by immersing a sample in a dilute aqueous hydrofluoric acid solution (HF: 1 wt %).

Reference Example 11

A test was conducted by immersing a sample in a mixed solution of an aqueous hydrofluoric acid solution (HF: 50 wt %) and aqueous ammonia ($NH_3$: 70 wt %). The mixing ratio of the raw material liquids is $HF:NH_3=9:75$.

Reference Example 12

A test was conducted by immersing a sample an aqueous TMAH solution (TMAH: 25%). The temperature of the aqueous TMAH solution is 40 degrees C.

B. Experimental Result

Figure 22:
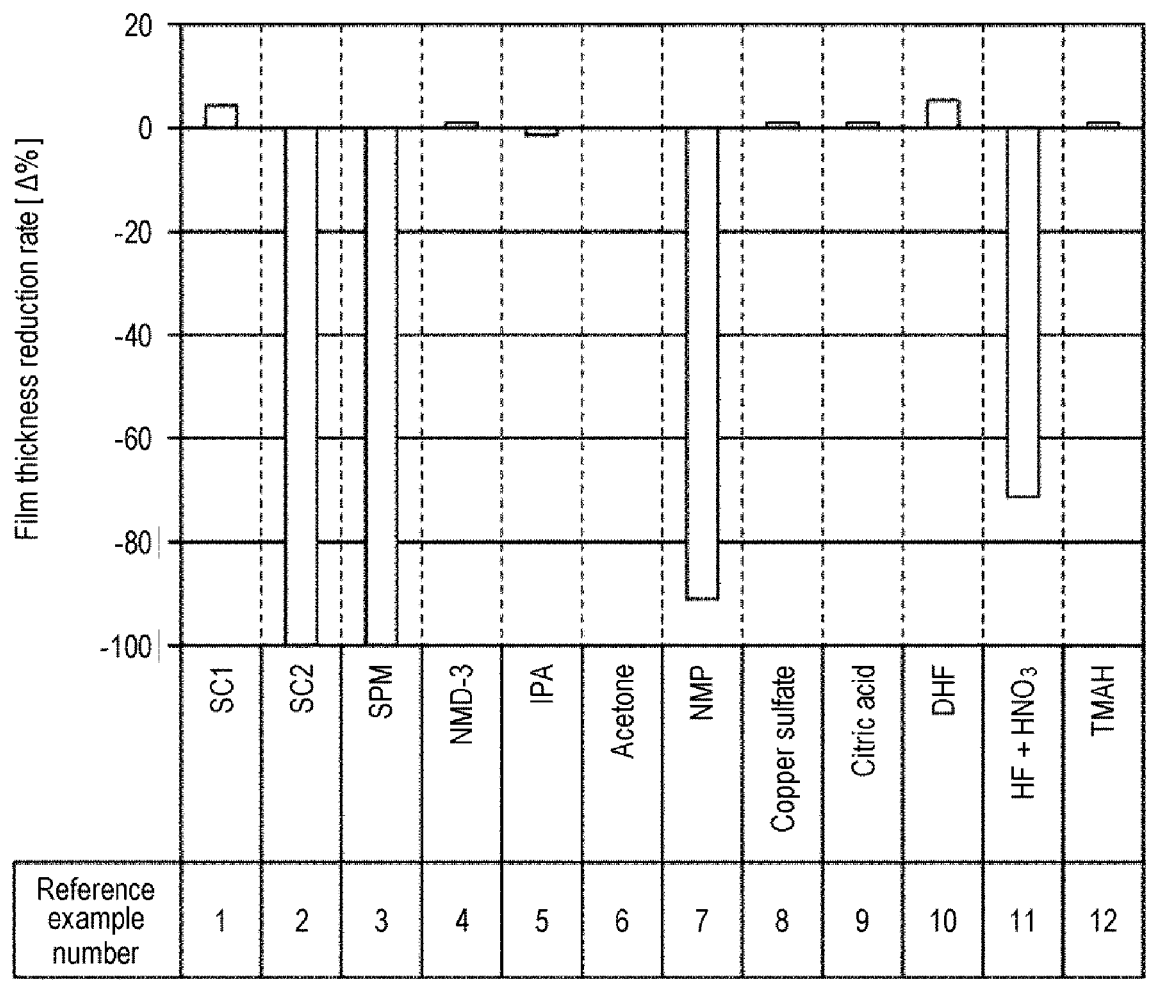
FIG. 22 is an explanatory view showing reduction rates of a film thickness when a polymer having a urea bond is processed with various etching solutions.

The results of Reference Examples 1 to 12 are shown in FIG. 22. The horizontal axis in FIG. 22 indicates the chemical solutions used for the respective tests together with the numbers of the reference examples, and the vertical axis indicates a reduction rate of the film thickness of the polyurea film 6 ({(film thickness after test−film thickness before test)/film thickness before test}×100 (Δ %)).

According to the results shown in FIG. 22, the polyurea film 6 used in the test could be removed by SC2, SPM, NMP, and a mixed solution of aqueous hydrofluoric acid solution and aqueous ammonia.

On the other hand, it was difficult to remove the polyurea film 6 by SC1, a resist developer (NMD-3), IPA, acetone, a copper sulfate solution, citric acid, DHF and TMAH. The test results showing that the film thickness is increased are thought to be that the polyurea film 6 was swelled by absorbing the chemical solution. For example, the a-Si film 33 described in the second embodiment can be removed by an alkaline-based etching solution. Therefore, it was confirmed that by using SC1 or TMAH, which is an alkaline chemical solution, as an etchant, it is possible to remove the a-Si film 33 while leaving the embed portion 6a made of polyurea.

In the present disclosure, a sacrificial film is removed in a state in which a polymer having a urea bond is embedded in a recess. Since the polymer can be relatively easily removed under conditions different from those at the time of removing the sacrificial film (for example, heating or use of other etchants), it is possible to remove the polymer embedded in the recess while suppressing occurrence of damage to a semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device by processing a substrate, comprising:
   forming an embed portion in which a polymer having a urea bond is embedded in a recess formed in the substrate and a polymer film made of the polymer having the urea bond is formed on a sacrificial film by supplying a material for polymerization from above the sacrificial film to the substrate, wherein a surface of the substrate is covered with the sacrificial film, the recess including an opening of the sacrificial film that is formed by a patterning;
   removing the polymer film formed on the sacrificial film while leaving the embed portion in the recess;
   removing the sacrificial film in a state in which the embed portion remains in the recess; and
   subsequently, removing the embed portion in the recess.

2. The method of claim 1, wherein the removing the sacrificial film includes using an etchant that is capable of reacting with the sacrificial film to remove the sacrificial film and that has a smaller reactivity to the embed portion than the sacrificial film.

3. The method of claim 1, wherein the removing the embed portion in the recess includes heating the embed portion to depolymerize the embed portion.

4. The method of claim 1, wherein the removing the polymer film formed on the sacrificial film includes heating the polymer film to depolymerize the polymer constituting the polymer film.

5. The method of claim 1, further comprising: before performing the forming the embed portion in the recess, forming the recess by etching the substrate using the sacrificial film as a mask.

6. The method of claim 1, further comprising: before performing the forming the embed portion in the recess, implanting ions into the recess by irradiating the substrate with ions.

7. The method of claim 1, wherein the forming the embed portion in the recess includes heating the polymer film formed on the sacrificial film to depolymerize a portion of the polymer film so that the polymer film having fluidity enters the recess.

8. The method of claim 1, wherein the forming the embed portion in the recess includes forming the polymer film on the sacrificial film while heating the substrate to depolymerize a portion of the polymer film so that the polymer film having fluidity enters the recess.

9. The method of claim 1, wherein the forming the embed portion in the recess includes forming the polymer film by supplying an isocyanate and an amine which stay in a vapor state to the substrate and heating the substrate to allow the isocyanate and the amine to undergo a polymerization reaction.

10. The method of claim 1, wherein the forming the embed portion in the recess includes forming the polymer film by supplying a solution containing an isocyanate and a solution containing an amine to the substrate and heating the substrate to allow the isocyanate and the amine to undergo a polymerization reaction.

* * * * *